United States Patent
Saito et al.

(10) Patent No.: US 10,937,918 B2
(45) Date of Patent: Mar. 2, 2021

(54) FLEXIBLE PRINTED CIRCUIT, AND CONCENTRATOR PHOTOVOLTAIC MODULE AND CONCENTRATOR PHOTOVOLTAIC PANEL USING SAME

(71) Applicant: Sumitomo Electric Industries, Ltd., Osaka (JP)

(72) Inventors: Kenji Saito, Osaka (JP); Youichi Nagai, Osaka (JP); Kenichi Hirotsu, Osaka (JP); Takashi Iwasaki, Osaka (JP); Shougo Asai, Koka (JP); Hiroyuki Matsuyama, Joetsu (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 255 days.

(21) Appl. No.: 15/302,888

(22) PCT Filed: Feb. 13, 2015

(86) PCT No.: PCT/JP2015/053942
§ 371 (c)(1),
(2) Date: Oct. 7, 2016

(87) PCT Pub. No.: WO2015/156028
PCT Pub. Date: Oct. 15, 2015

(65) Prior Publication Data
US 2017/0033249 A1   Feb. 2, 2017

(30) Foreign Application Priority Data
Apr. 10, 2014 (JP) .............................. JP2014-081023

(51) Int. Cl.
*H01L 31/05* (2014.01)
*H05K 1/02* (2006.01)
(Continued)

(52) U.S. Cl.
CPC ............ *H01L 31/05* (2013.01); *H01L 31/048* (2013.01); *H01L 31/049* (2014.12);
(Continued)

(58) Field of Classification Search
None
See application file for complete search history.

(56) References Cited

U.S. PATENT DOCUMENTS

| 4,224,081 A | 9/1980 | Kawamura et al. |
| 2013/0146120 A1* | 6/2013 | Seel .................. H01L 31/18 136/246 |

(Continued)

FOREIGN PATENT DOCUMENTS

| JP | 51-062691 A | 5/1976 |
| JP | 52-122487 A | 10/1977 |

(Continued)

OTHER PUBLICATIONS

English Translation WO2013114685 (Year: 2013).*
(Continued)

*Primary Examiner* — Shannon M Gardner
(74) *Attorney, Agent, or Firm* — Baker Botts L.L.P.; Michael A. Sartori

(57) ABSTRACT

Provided is a flexible printed circuit including: a film-shaped insulating base material having flexibility and having a withstand voltage value of at least 2000 V; and an electric conductor layer formed on the insulating base material and forming a circuit pattern, wherein with respect to the insulating base material, a principal component thereof is a polyimide and a filler content thereof is 0%. Thus, a flexible printed circuit can be obtained that has an insulating base material which suppresses decrease in withstand voltage performance even in a high humidity environment.

2 Claims, 8 Drawing Sheets

(51) Int. Cl.
*H02S 20/10* (2014.01)
*H01L 31/049* (2014.01)
*H01L 31/054* (2014.01)
*H01L 31/048* (2014.01)
*H05K 1/03* (2006.01)

(52) U.S. Cl.
CPC .......... *H01L 31/0543* (2014.12); *H02S 20/10* (2014.12); *H05K 1/028* (2013.01); *H05K 1/0257* (2013.01); *H05K 1/0373* (2013.01); *H05K 1/0346* (2013.01); *H05K 1/0393* (2013.01); *H05K 2201/0154* (2013.01); *H05K 2201/2009* (2013.01); *Y02E 10/52* (2013.01)

(56) References Cited

U.S. PATENT DOCUMENTS

| | | | |
|---|---|---|---|
| 2014/0093723 | A1 | 4/2014 | Takeuchi et al. |
| 2014/0230883 | A1* | 8/2014 | Iwasaki ............... H01L 31/0504 136/246 |

FOREIGN PATENT DOCUMENTS

| | | | |
|---|---|---|---|
| JP | 05-025295 | A | 2/1993 |
| JP | 06-220195 | A | 8/1994 |
| JP | 2002-217508 | A | 8/2002 |
| JP | 2006-083206 | A | 3/2006 |
| JP | 2007-254643 | A | 10/2007 |
| JP | 2008-218579 | A | 9/2008 |
| JP | 2013-080760 | A | 5/2013 |
| JP | 2013-149831 | A | 8/2013 |
| JP | 2013-161867 | A | 8/2013 |
| WO | 2011/111684 | A1 | 9/2011 |
| WO | 2012165265 | A1 | 12/2012 |
| WO | 2013/051426 | A1 | 4/2013 |
| WO | WO-2013114685 | A1 * | 8/2013 ......... H01L 21/6835 |

OTHER PUBLICATIONS

Office Action in counterpart Japanese Patent Application No. 2010-081023, dated Sep. 1, 2016.
Decision of Refusal in counterpart Japanese Patent Application No. 2014-081023, dated Feb. 2, 2016.
International Search Report in International Application No. PCT/JP2015/053942, dated Apr. 21, 2016.

* cited by examiner

FLEXIBLE PRINTED CIRCUIT, AND CONCENTRATOR PHOTOVOLTAIC MODULE AND CONCENTRATOR PHOTOVOLTAIC PANEL USING SAME

TECHNICAL FIELD

The present invention relates to a flexible printed circuit to be used in a concentrator photovoltaic module which is a component of a concentrator photovoltaic panel, for example.

BACKGROUND ART

A unit serving as an optical-system basic unit for concentrator photovoltaic (CPV) generates power by guiding, to a small cell, a light spot which is formed by light being converged by a concentrating portion composed of a Fresnel lens. As the cell, a solar battery having a high power generation efficiency is used. With such a configuration, large optical energy can be concentrated on a small cell, and thus, power can be generated at a high efficiency. A large number of such units are arranged in a matrix shape to form a concentrator photovoltaic module, and further, a large number of the modules are arranged in a matrix shape to form a concentrator photovoltaic panel. Such a concentrator photovoltaic panel is caused to perform tracking operation by a drive device so that the concentrator photovoltaic panel always faces the sun, whereby highly-efficient power generation during day time can be realized.

In one module, the cells are disposed so as to be in one-to-one correspondence to a large number of Fresnel lenses. In addition, each cell is mounted to a circuit board. Mounting all the cells on one large substrate requires a very large substrate, and results in difficult manufacturing and large cost. Meanwhile, by arranging only a necessary number of substrates being made of a resin or the like and having a size that allows easy manufacture thereof, and by mounting a plurality of cells on each substrate, it is possible to realize a configuration in which the cells by the same number of Fresnel lenses as a whole are arranged in a matrix shape.

Further, from the viewpoint of reducing cost and improving heat dissipation performance, a configuration is also conceivable in which: instead of the substrate made of a resin or the like, a strip-film-shaped (ribbon-shaped) flexible printed circuit having mounted cells thereto is laid throughout on the bottom surface of the housing of a module such that the cells are disposed at the respective light-concentrating positions (see PATENT LITERATURE 1, paragraph [0026], for example).

As an insulating base material for the flexible printed circuit, a polyimide film is used in general (see PATENT LITERATURE 2 to 4, for example). For easier handling of such a polyimide film through provision of slidability thereto, the polyimide film has a filler such as calcium phosphate added thereto. The added amount is selected from the viewpoint of ensuring slidability.

CITATION LIST

Patent Literature

PATENT LITERATURE 1: Japanese Laid-Open Patent Publication No. 2013-161867
PATENT LITERATURE 2: Japanese Laid-Open Patent Publication No. H6-220195
PATENT LITERATURE 3: Japanese Laid-Open Patent Publication No. H5-25295
PATENT LITERATURE 4: Japanese Laid-Open Patent Publication No. 2006-83206

SUMMARY OF INVENTION

Technical Problem

When the flexible printed circuit is used in a weak current apparatus, such as a mobile phone, for example, high withstand voltage performance is not required in the flexible printed circuit itself.

However, when the flexible printed circuit is used in a concentrator photovoltaic module, there are cases where voltage of several hundred to 1000 volts is applied due to a series connection of the cell. In the case of such a system voltage (working voltage), the required withstand voltage value is still higher, and is 2 times+1000 V of the system voltage, for example. Therefore, if the system voltage is 1000 V, the withstand voltage value becomes 3000 V.

Further, in the case of the concentrator photovoltaic module, since the concentrator photovoltaic module is used outdoor where temperature and humidity change to a great extent, there are cases where the humidity inside the module becomes 100% or as high as close to 100%, due to dewing or entry of rain. In such a state, there are cases where the insulation performance of the insulating base material in the flexible printed circuit is decreased and the flexible printed circuit cannot withstand high voltage.

In view of the above conventional problem, an object of the present invention is to provide a flexible printed circuit having an insulating base material which suppresses decrease in withstand voltage performance even in a high humidity environment, and to provide a concentrator photovoltaic module and a concentrator photovoltaic panel using the same.

Solution to Problem

The present invention is a flexible printed circuit including: a film-shaped insulating base material having flexibility and having a withstand voltage value of at least 2000 V; and an electric conductor layer formed on the insulating base material and forming a circuit pattern, wherein with respect to the insulating base material, a principal component thereof is a polyimide and a filler content thereof is 0%.

Moreover, the present invention is a flexible printed circuit including: a film-shaped insulating base material having flexibility and having a withstand voltage value of at least 2000 V; and an electric conductor layer formed on the insulating base material and forming a circuit pattern, wherein with respect to the insulating base material, a thickness thereof is in a range of 10 μm to 50 μm, a principal component thereof is a polyimide, and a filler content thereof is not greater than 0.2%.

Moreover, the present invention is a concentrator photovoltaic module including: a housing having a planar bottom surface; a flexible printed circuit arranged in a plurality of rows on the bottom surface; a concentrating portion mounted to the housing and formed by a plurality of lens elements being arrayed, each lens element being configured to converge sun light; and cells mounted to the flexible printed circuit so as to correspond to light-concentrating positions of the respective lens elements, each cell being configured to receive the converged light to generate power, wherein the flexible printed circuit includes: a strip-filmshaped insulating base material having flexibility and having a withstand voltage value of at least 2000 V; and an electric conductor layer formed on the insulating base material and forming a circuit pattern, and with respect to the insulating base material, a principal component thereof is a polyimide and a filler content thereof is 0%.

Moreover, the present invention is a concentrator photovoltaic module including: a housing having a planar bottom surface; a flexible printed circuit arranged in a plurality of rows on the bottom surface; a concentrating portion mounted to the housing and formed by a plurality of lens elements being arrayed, each lens element being configured to converge sun light; and cells mounted to the flexible printed circuit so as to correspond to light-concentrating positions of the respective lens elements, each cell being configured to receive the converged light to generate power, wherein the flexible printed circuit includes: a strip-film-shaped insulating base material having flexibility and having a withstand voltage value of at least 2000 V; and an electric conductor layer formed on the insulating base material and forming a circuit pattern, and with respect to the insulating base material, a thickness thereof is in a range of 10 µm to 50 µm, a principal component thereof is a polyimide, and a filler content thereof is not greater than 0.2%.

Advantageous Effects of Invention

With the flexible printed circuit of the present invention, and the concentrator photovoltaic module and the concentrator photovoltaic panel using the same, it is possible to suppress decrease in the withstand voltage performance of the insulating base material even in a high humidity environment.

DESCRIPTION OF EMBODIMENTS

Summary of Embodiment

Figure 1:
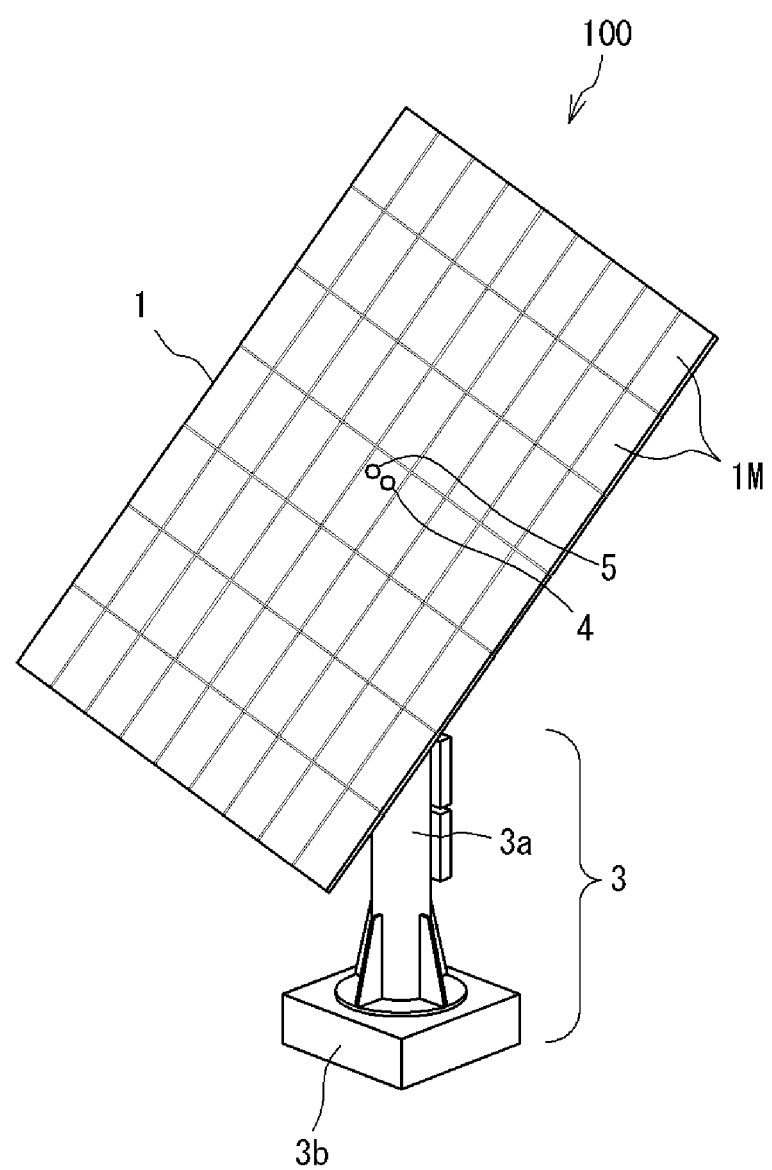
FIG. 1 is a perspective view showing one example of a concentrator photovoltaic apparatus.

The summary of embodiment of the present invention includes at least the following.

(1) This is a flexible printed circuit including: a film-shaped insulating base material having flexibility and having a withstand voltage value of at least 2000 V; and an electric conductor layer formed on the insulating base material and forming a circuit pattern, wherein with respect to the insulating base material, a principal component thereof is a polyimide and a filler content thereof is 0%.

In the flexible printed circuit configured as above, since the insulating base material does not contain any filler, the hygroscopicity can be suppressed at a low level. Thus, the withstand voltage performance can be maintained at a high level.

(2) This is a flexible printed circuit including: a film-shaped insulating base material having flexibility and having a withstand voltage value of at least 2000 V; and an electric conductor layer formed on the insulating base material and forming a circuit pattern, wherein with respect to the insulating base material, a thickness thereof is in a range of 10 µm to 50 µm, a principal component thereof is a polyimide, and a filler content thereof is not greater than 0.2%.

When the filler content exceeds 0.2%, the higher the required withstand voltage value is, the more significant the decrease in the withstand voltage performance becomes due to moisture absorption. However, with the flexible printed circuit configured as above, the hygroscopicity can be suppressed at a low level by making the filler content not greater than 0.2%. Thus, the withstand voltage performance can be maintained at a high level.

(3) This is a concentrator photovoltaic module including: a housing having a planar bottom surface; a flexible printed circuit arranged in a plurality of rows on the bottom surface; a concentrating portion mounted to the housing and formed by a plurality of lens elements being arrayed, each lens element being configured to converge sun light; and cells mounted to the flexible printed circuit so as to correspond to light-concentrating positions of the respective lens elements, each cell being configured to receive the converged light to generate power, wherein the flexible printed circuit includes: a strip-film-shaped insulating base material having flexibility and having a withstand voltage value of at least 2000 V; and an electric conductor layer formed on the insulating base material and forming a circuit pattern, and with respect to the insulating base material, a principal component thereof is a polyimide and a filler content thereof is 0%.

With respect to the flexible printed circuit in the concentrator photovoltaic module configured as above, since the insulating base material does not contain any filler, the hygroscopicity can be suppressed at a low level. Therefore, even when the state inside the concentrator photovoltaic module becomes a high humidity state due to dewing or the like, the withstand voltage performance of the flexible printed circuit can be maintained at a high level.

(4) This is a concentrator photovoltaic module including: a housing having a planar bottom surface; a flexible printed circuit arranged in a plurality of rows on the bottom surface; a concentrating portion mounted to the housing and formed by a plurality of lens elements being arrayed, each lens element being configured to converge sun light; and cells mounted to the flexible printed circuit so as to correspond to light-concentrating positions of the respective lens elements, each cell being configured to receive the converged light to generate power, wherein the flexible printed circuit includes: a strip-film-shaped insulating base material having flexibility and having a withstand voltage value of at least 2000 V; and an electric conductor layer formed on the insulating base material and forming a circuit pattern, and with respect to the insulating base material, a thickness thereof is in a range of 10 μm to 50 μm, a principal component thereof is a polyimide, and a filler content thereof is not greater than 0.2%.

When the filler content exceeds 0.2%, the higher the required withstand voltage value is, the more significant the decrease in the withstand voltage performance becomes due to moisture absorption. However, with the flexible printed circuit in the concentrator photovoltaic module configured as above, the hygroscopicity can be suppressed at a low level by making the filler content not greater than 0.2%. Therefore, even when the state inside the concentrator photovoltaic module becomes a high humidity state due to dewing or the like, the withstand voltage performance of the flexible printed circuit can be maintained at a high level.

(5) Moreover, a concentrator photovoltaic panel can be formed by a plurality of the concentrator photovoltaic modules being arranged, according to (3) or (4) above.

With this concentrator photovoltaic panel, even when the state inside each concentrator photovoltaic module becomes a high humidity state due to dewing or the like, the withstand voltage performance of the flexible printed circuit can be maintained at a high level.

Details of Embodiment

Concentrator Photovoltaic Panel and Concentrator Photovoltaic Apparatus

First, a configuration of a concentrator photovoltaic apparatus will be described.

FIG. 1 is a perspective view showing one example of a concentrator photovoltaic apparatus. In FIG. 1, a concentrator photovoltaic apparatus 100 includes: a concentrator photovoltaic panel 1; and a pedestal 3 which includes a post 3a and a base 3b therefor, the post 3a supporting the concentrator photovoltaic panel 1 on the rear surface side thereof. The concentrator photovoltaic panel 1 is formed by assembling a large number of concentrator photovoltaic modules 1M vertically and horizontally. In this example, 62 (7 in length×9 in breadth−1) concentrator photovoltaic modules 1M except the center portion are assembled vertically and horizontally. When one concentrator photovoltaic module 1M has a rated output of about 100 W, for example, the entirety of the concentrator photovoltaic panel 1 has a rated output of about 6 kW.

A drive device (not shown) is provided on the rear surface side of the concentrator photovoltaic panel 1. By causing this drive device to operate, it is possible to drive the concentrator photovoltaic panel 1 in two axes of azimuth and elevation. Accordingly, the concentrator photovoltaic panel 1 is driven so as to always face the direction of the sun both in azimuth and elevation. At a place in the concentrator photovoltaic panel 1 (at the center portion in this example) or in a vicinity of the panel 1, a tracking sensor 4 and a pyrheliometer 5 are provided. The operation of tracking the sun is performed on the basis of the tracking sensor 4, and the position of the sun calculated from the time and the latitude and the longitude of the installation place.

Concentrator Photovoltaic Module

Figure 2:
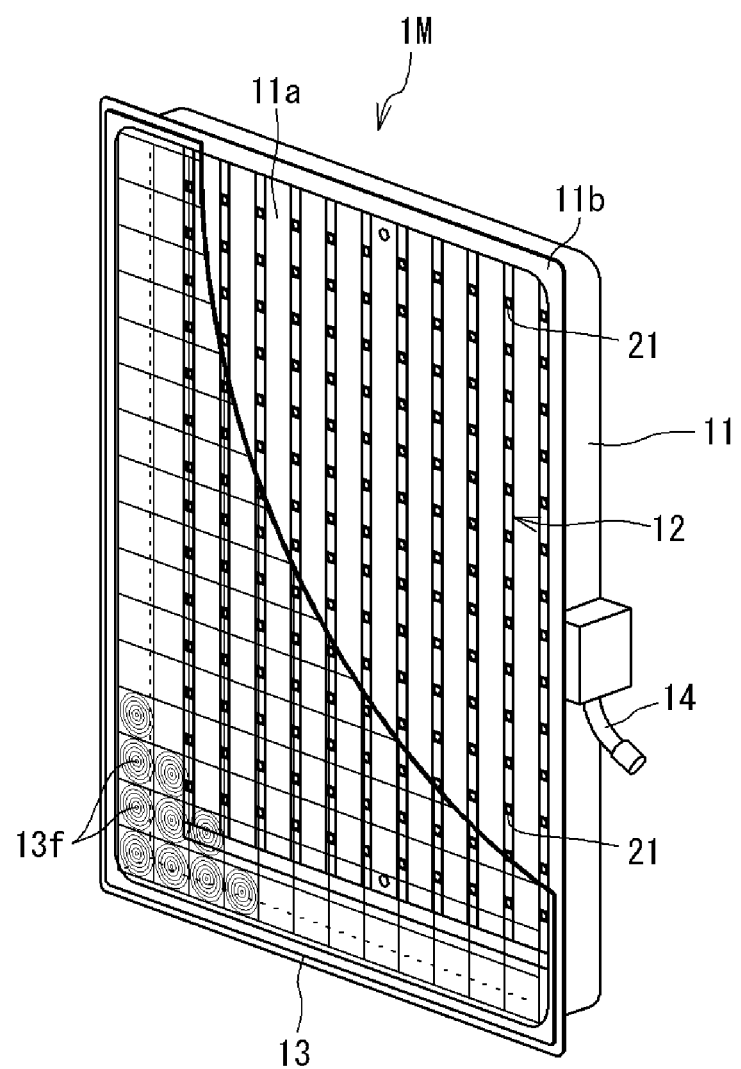
FIG. 2 is a perspective view (partially cut out) showing an enlarged view of one example of a concentrator photovoltaic module.

FIG. 2 is a perspective view (partially cut out) showing an enlarged view of one example of a concentrator photovoltaic module (hereinafter, also simply referred to as module) 1M (however, a shielding plate described later is not shown). In FIG. 2, the module 1M includes, as main components: a housing 11 formed in a vat shape and having a flat bottom surface 11a; a flexible printed circuit 12 disposed so as to be in contact with the bottom surface 11a and in a plurality of rows; and a concentrating portion 13 mounted, like a cover, to a flange portion 11b of the housing 11. The housing 11 is made of a metal.

The flexible printed circuit 12 is obtained by providing an electric conductor layer forming a circuit pattern on a strip-film-shaped insulating base material. On top of this, cells 21 and other electronic components are mounted. As each cell 21, a solar battery having heat resistance and a high power generation efficiency is used.

The concentrating portion 13 is a Fresnel lens array and is formed by arranging, in a matrix shape, a plurality of Fresnel lenses 13f (for example, 16 in length×12 in breadth, 192 in total) which concentrate sun light. Such a concentrating portion 13 can be obtained by, for example, forming a silicone resin film on a back surface (inside) of a glass plate used as a base material. Each Fresnel lens 13f is formed on this resin film. The total number and the arrangement of the Fresnel lenses 13f are the same as the total number and the arrangement of the cells 21, and the Fresnel lenses 13f and the cells 21 are in one-to-one correspondence with each other so that their optical axes are aligned with each other. A connector 14 for taking out the output of the module 1M is provided on the external surface of the housing 11.

Configuration of Flexible Printed Circuit

Figure 3:
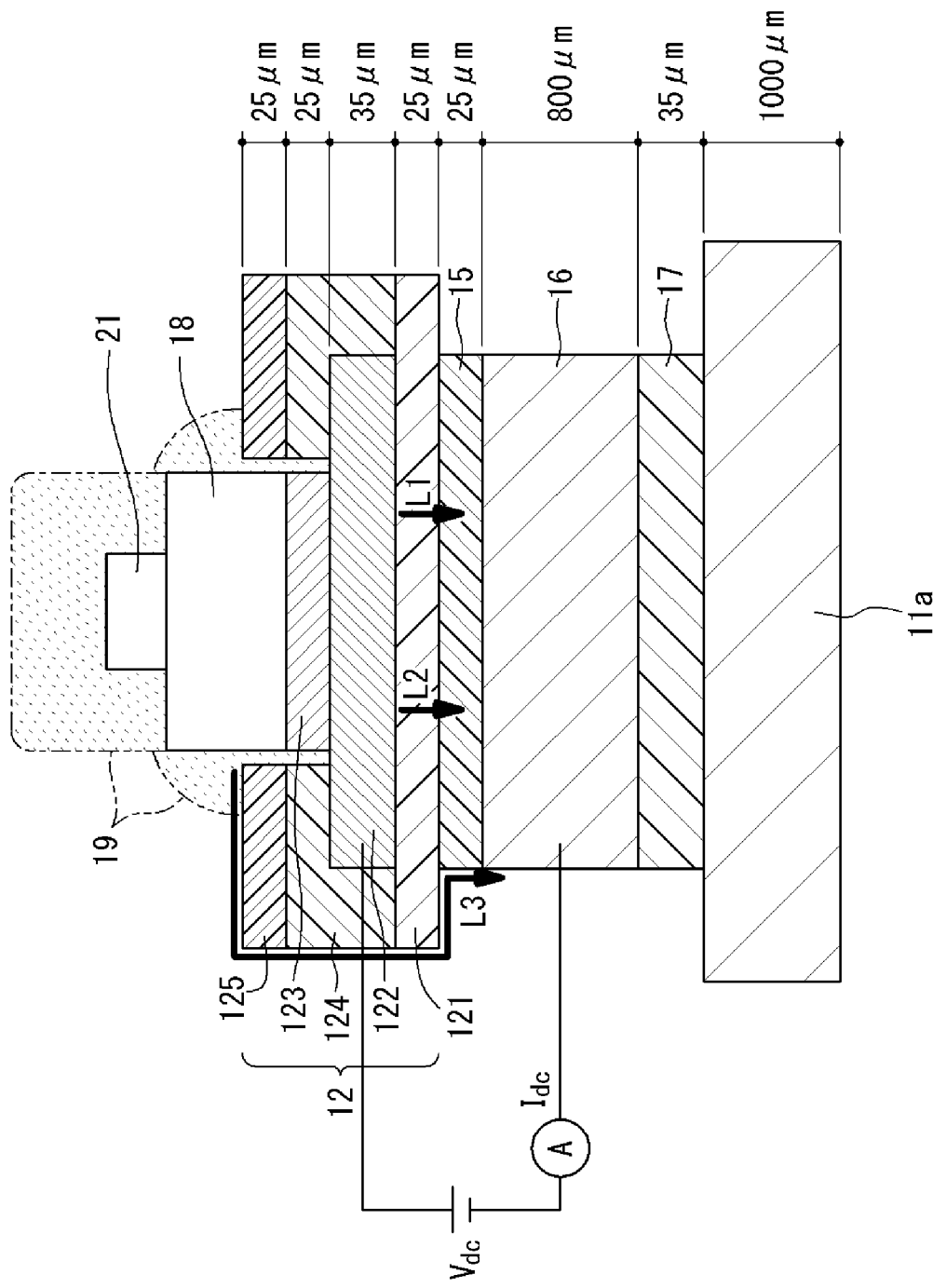
FIG. 3 is a cross-sectional view orthogonal to the longitudinal direction in the flexible printed circuit shown in FIG. 2, and is a cross-sectional view of the vicinity of a cell.

FIG. 3 is a cross-sectional view orthogonal to the longitudinal direction in the flexible printed circuit 12 shown in FIG. 2, and is a cross-sectional view of the vicinity of the cell 21. It should be noted that the shown thickness dimensions are merely examples. Also, this figure is for schematic representation of the cross sectional structure, and is not necessarily proportional to the actual size.

In FIG. 3, the flexible printed circuit 12 includes: an insulating base material 121 (thickness 25 μm) made of a polyimide; an electric conductor layer 122 (thickness 35 μm) provided on top of the insulating base material 121, made of copper, and forming a circuit pattern; a solder portion 123 which connects a cell 21 packaged together with a lead frame 18 to the electric conductor layer 122 via the lead frame 18; an adhesive layer 124 (maximum thickness 60 μm); and a cover layer 125 (thickness 25 μm) made of a polyimide. The insulating base material 121 has flexibility and has a strip-film shape (ribbon shape extending in the longitudinal direction). The flexible printed circuit 12, also as a whole, has a thickness of about 110 μm, has a strip-film-shape, and has flexibility.

A reinforcement portion 16 (thickness 800 μm) made of an aluminium alloy is mounted to the lower surface of the insulating base material 121, via an adhesive layer 15 (thickness 25 μm). The reinforcement portion 16 allows the flexible printed circuit 12 to have a certain rigidity, thereby facilitating handling during mounting of the flexible printed circuit 12. In addition, the reinforcement portion 16 also contributes to dissipation of heat from the flexible printed circuit 12 to the bottom surface 11a of the housing 11. The reinforcement portion 16 is fixed to the bottom surface 11a (thickness 1000 μm=1 mm) with a double-sided tape 17 (thickness 35 μm) which has electric conductivity (which also has good thermal conductivity).

The cell 21 is packaged together with the lead frame 18 for taking out an output. The lead frame 18 is electrically and mechanically connected to the electric conductor layer 122 via the solder portion 123. The top and the periphery of the cell 21 and the periphery of the lead frame 18 are covered with a transparent silicone resin layer 19.

The potential of the bottom surface 11a of the housing 11 is maintained at the ground potential. Therefore, the potential of the reinforcement portion 16 mounted to the bottom surface 11a via the electrically conductive double-sided tape 17 also is the ground potential. A direct-current voltage generated through solar photovoltaic power generation is applied to the electric conductor layer 122. Accordingly, a current $I_{dc}$ caused to flow due to a potential difference $V_{dc}$ between the electric conductor layer 122 and the reinforcement portion 16 needs to be suppressed to less than a predetermined value $I_L$ of an allowable level ($I_{dc}<I_L$) by means of the insulating base material 121 and the adhesive layer 15. As indicated by arrows in FIG. 3, for example, the current leak includes a current leak L1 which penetrates the insulating base material 121 and the adhesive layer 15, a current leak L2 caused by a void (not shown) in the adhesive layer 15 locally reducing the withstand voltage value, and a current leak L3 which flows from the lead frame 18 on the external surface against insulation.

Relationship Between Filler for Insulating Base Material, and Withstand Voltage Performance and Slidability The present inventors examined what change appears in withstand voltage performance and slidability by changing the content of a filler contained in the insulating base material 121 whose principal component is a polyimide. Hereinafter, the examination result will be described in detail. As the filler, calcium pyrophosphate was used.

As the filler, calcium phosphate, calcium carbonate, and silica are also appropriate, other than calcium pyrophosphate. However, here, as a representative, a case where the filler was calcium pyrophosphate was examined.

The kinds of the insulating base material 121 used in the examination are shown in table 1. Here, with respect to the thickness of the insulating base material 121, the nominal value is 25 μm, and the measured value is also approximately 25 μm.

TABLE 1

| | Conventional article | Article containing filler by 0.2% | Article containing filler by 0.1% | Non-filler |
|---|---|---|---|---|
| Nominal thickness [μm] | 25 | 25 | 25 | 25 |
| Measured thickness [μm] | 24.9 | 24.8 | 25.0 | 24.8 |

It is preferable that the thickness of the insulating base material 121 is in the range of 10 μm to 50 μm (not less than 10 μm and not greater than 50 μm). When the thickness is less than 10 μm, it becomes difficult to ensure a necessary withstand voltage value. When the thickness exceeds 50 μm, it becomes difficult to ensure a necessary thermal conductivity (heat dissipation performance). The thickness 10 μm to 50 μm for the insulating base material 121 is a preferable range for realizing both the necessary withstand voltage value and the necessary thermal conductivity.

The concept regarding the withstand voltage is as follows according to the IEC standard (62108, 62688).

The withstand voltage performance in the case of grade A is being able to withstand (system voltage×4)+2000 V for two minutes.

The withstand voltage performance in the case of grade B is being able to withstand (system voltage×2)+1000 V for two minutes.

The system voltage is 500 to 1000 V in general, and a target therefor can be 500 V, 600 V, or 1000 V, for example.

When the system voltage is 1000 V, the withstand voltage value for grade A is 6000 V, and the withstand voltage value for grade B is 3000 V.

When the system voltage is 600 V, the withstand voltage value for grade A is 4400 V and the withstand voltage value for grade B is 2200 V.

When the system voltage is 500 V, the withstand voltage value for grade A is 4000 V, and the withstand voltage value for grade B is 2000 V.

Therefore, an insulating base material for a flexible printed circuit to be used in a concentrator photovoltaic module is required to have insulation performance capable of withstanding at least 2000 V, preferably 3000 V or greater. When the system voltage is 1000 V, the withstand voltage for grade B is 3000 V.

Figure 4:
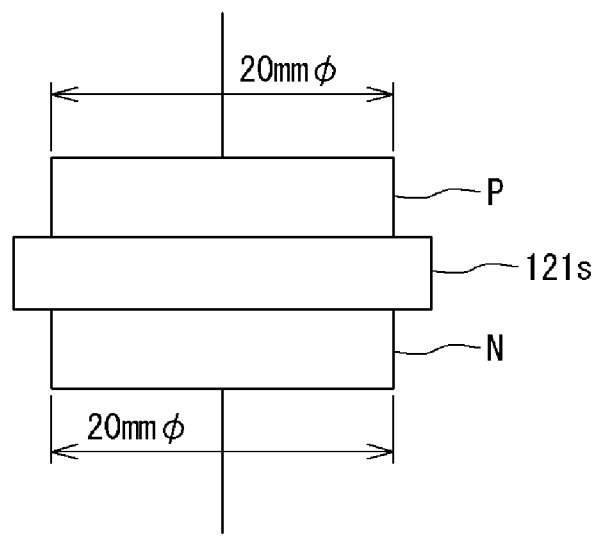
FIG. 4 is a schematic diagram showing a configuration of a withstand voltage performance test.

FIG. 4 is a schematic diagram showing a configuration of a withstand voltage performance test. The test condition was as follows. An insulating base material 121s serving as a sample (hereinafter, simply referred to as sample) was interposed between disc electrodes P and N each having a diameter of 20 mm, and then, direct-current voltage was applied. The applied voltage was 3600 V, and the step-up condition was 500 V/sec. The time period during which 3600 V was applied was 300 seconds at maximum. The sample was prepared in three states in which:

(a) the sample in an ordinary state (not immersed in water);

(b) the sample immediately after being taken out of pure water where the sample has been immersed at 23° C. for 10 hours; and (c) the sample immediately after being taken out of pure water where the sample has been immersed at 23° C. for 24 hours.

The sample itself was prepared in four kinds:

(1) conventional article (filler content 2%);

(2) article having filler content of 0.2%;

(3) article having filler content of 0.1%; and (4) non-filler article that does not contain any filler (filler content 0%)

It should be noted the contents above are expressed in mass %.

Figure 5:
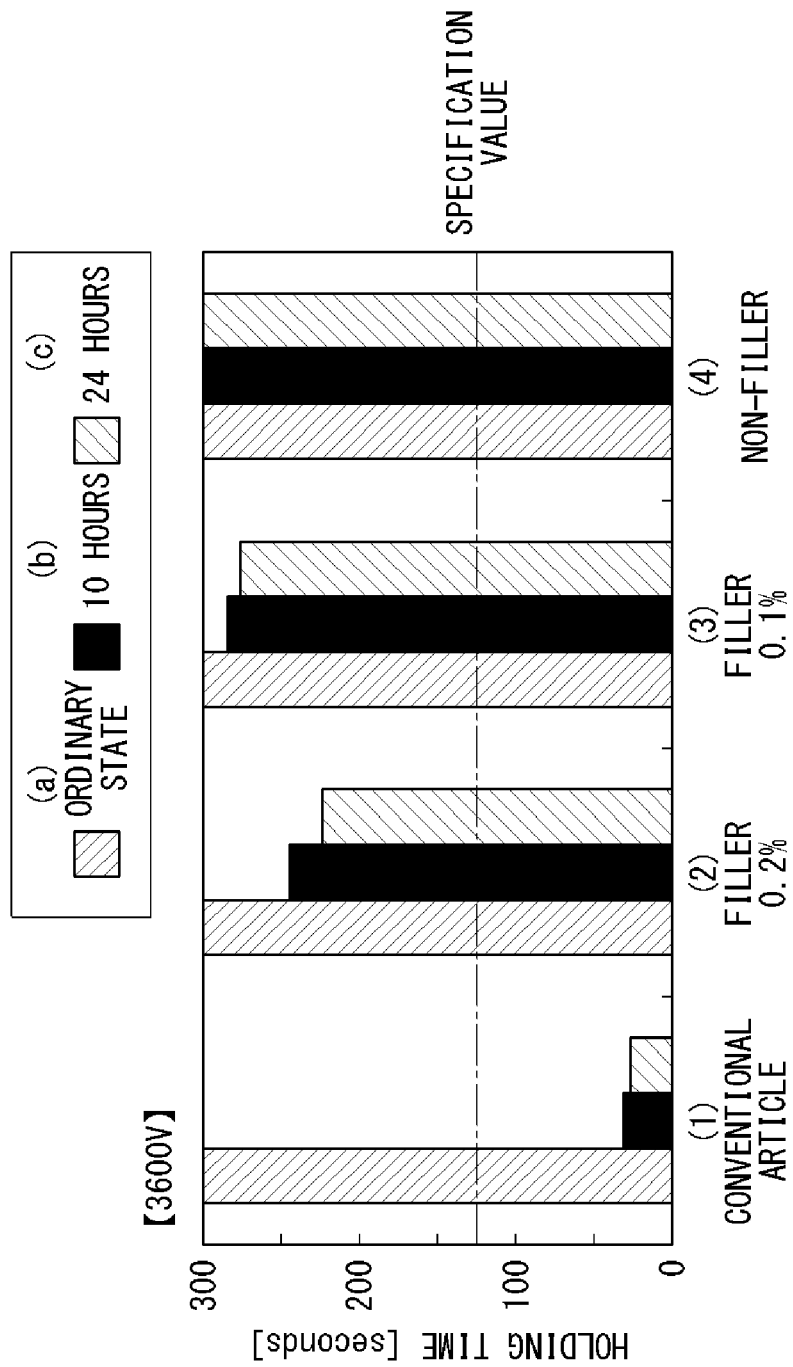
FIG. 5 is a bar graph indicating, with respect to four kinds of samples in three kinds of states, holding time [seconds] during which a certain withstand voltage performance can be maintained against an applied voltage of 3600 V.

FIG. 5 is a bar graph indicating, with respect to the four kinds of samples in the three kinds of states (a), (b), and (c) defined above, a time period until a current leak $I_{dc}$ (?$I_L$) not less than a predetermined value $I_L$ is detected under the applied voltage of 3600 V, i.e., holding time [seconds] during which a certain withstand voltage performance can be maintained. In FIG. 5, in the case of "(a) ordinary state" i.e., non-immersion in water, all samples attain 300 seconds. However, in the case of "(b) 10 hours", with respect to the conventional article sample (1), the holding time is considerably decreased and is far from the specification value (120 seconds). With respect to other samples (2) and (3), the holding time is slightly decreased but satisfies the specification value. With respect to non-filler sample (4), the holding time is not decreased.

Further, in the case of "(c) 24 hours", with respect to the conventional article sample (1), the holding time is further decreased, and is far from the specification value (about 120 seconds). Also with respect to other samples (2) and (3), the holding time is further decreased, but still satisfies the specification value. With respect to the non-filler sample (4), decrease in the holding time is not observed.

When summarizing the result shown in FIG. 5, with respect to "(1) conventional article", it is seen that after the immersion in water, the withstand voltage performance against the applied voltage 3600 V is considerably decreased and does not satisfy the specification value. With respect to "(2) filler 0.2%" and "(3) filler 0.1%", the withstand voltage performance is decreased in accordance with the time period of the immersion in water, but satisfies the specification value. With respect to "(4) non-filler", even after the immersion in water, the withstand voltage performance is not decreased.

That is, in terms of the withstand voltage performance in the case of the immersion in water performed, "non-filler" is best, followed by "filler 0.1%" and then by "filler 0.2%", in this order, and "conventional article" is not appropriate.

Figure 6:
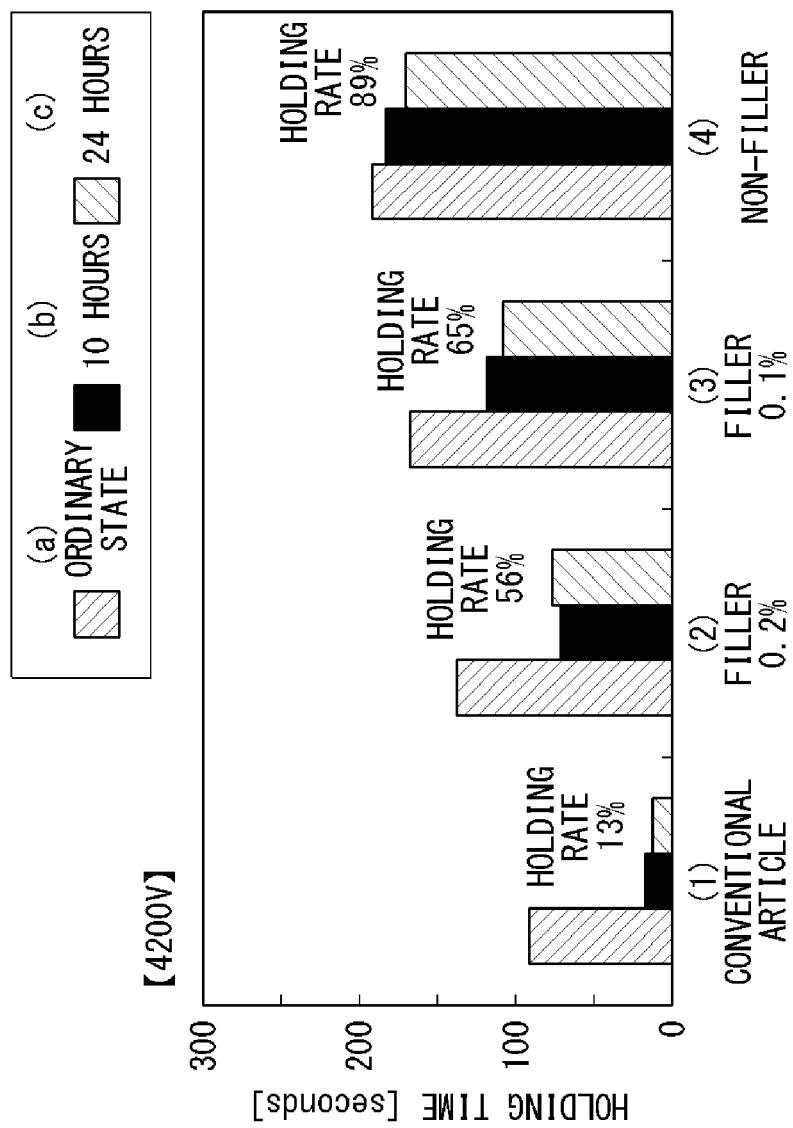
FIG. 6 is a bar graph indicating, with respect to the four kinds of samples in the three kinds of states, holding time [seconds] during which a certain withstand voltage performance is maintained when the applied voltage is raised to 4200 V.

FIG. 6 is a bar graph indicating, with respect to the same four kinds of samples as in FIG. 5 in the same three kinds of states (a), (b), and (c) defined above, the holding time [seconds] during which a certain withstand voltage performance is maintained when the applied voltage is raised to 4200 V. This can be said as an examination for confirming how change in the holding time appears when an intentionally-raised voltage is applied.

Here, with respect to all the samples, the holding time after the immersion in water shows decrease when compared with that in "(a) ordinary state". However, with the extent of the decrease focused, when the holding time after the immersion for 24 hours relative to the holding time in the ordinary state is expressed in the rate [%], "(1) conventional article" exhibits 13%, "(2) filler 0.2%" exhibits 56%, "(3) filler 0.1%" exhibits 65%, and "(4) non-filler" exhibits 89%.

That is, in the viewpoint of suppressing decrease in withstand voltage performance after immersion in water, "non-filler" is best, followed by "filler 0.1%" and then "filler 0.2%", in this order, and "conventional article" is inferior.

From the result above, the following conclusion can be derived.

First, the target is an insulating base material for a flexible printed circuit, the insulating base material having a withstand voltage value of at least 2000 V. As such an insulating base material, if an insulating base material whose principal component is a polyimide and whose filler content is 0% (non-filler) is used, it is possible to suppress the hygroscopicity at a very low level because the insulating base material does not contain a filler. Thus, the withstand voltage performance can be maintained at a high level. In addition, even when the state inside the concentrator photovoltaic module becomes a high humidity state due to dewing or the like, the withstand voltage performance of the flexible printed circuit can be maintained at a high level.

Also, even when the insulating base material is not a "non-filler", if an insulating base material is used whose thickness is in the range of 10 μm to 50 μm, whose principal component is a polyimide, and whose filler content is not greater than 0.2%, the hygroscopicity can be suppressed at a low level. Thus, the withstand voltage performance can be maintained at a high level. In addition, even when the state inside the concentrator photovoltaic module becomes a high humidity state due to dewing or the like, the withstand voltage performance of the flexible printed circuit can be maintained at a high level. It should be noted that, if the filler content exceeds 0.2%, as shown by the "(2) filler 0.2%" sample in FIG. 6, decrease in the withstand voltage performance becomes significant due to moisture absorption. The "(2) filler 0.2%" sample satisfies the necessary withstand voltage performance in FIG. 5, but does not satisfy the withstand voltage performance when the voltage is increased to 4200 V, and thus, can be considered as the upper limit line for preferable content. That is, it can be considered that 0.2% is the upper limit for the filler.

Figure 7:
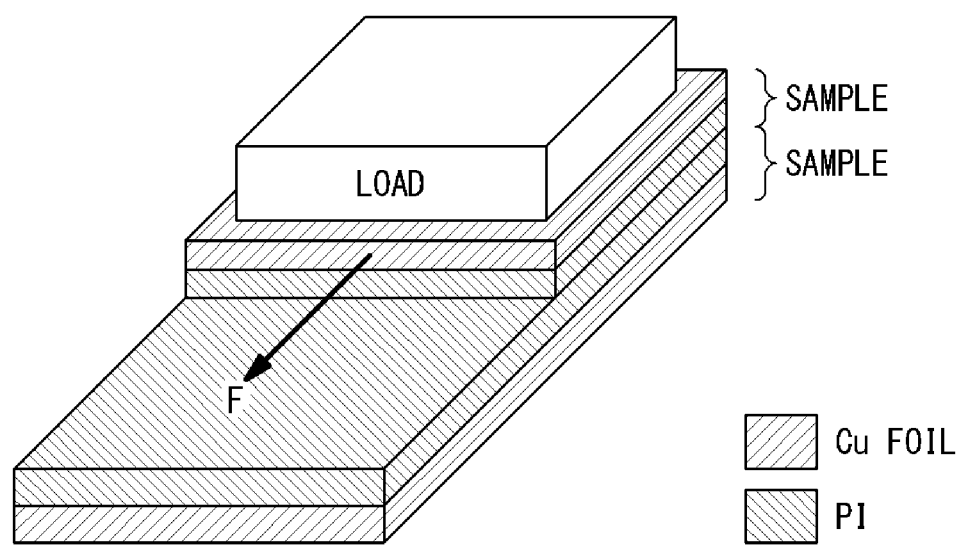
FIG. 7 is a schematic diagram showing how to conduct a slidability test.

Next, FIG. 7 is a schematic diagram showing how to conduct a slidability test. The sample is obtained by forming a copper foil on an insulating base material made of a polyimide (P1). In FIG. 7, the respective materials are represented by hatchings having different directions. From a stationary state where the two samples, i.e., the polyimide insulating base materials, are in contact with each other under a load (weight 200 g on 64 cm$^2$=80 mm×80 mm), a force F for moving the upper sample in the arrow direction is applied. This force F is proportional to the friction force at surface contact between the insulating base materials. The larger the value of F is, the worse the slidability is, and the smaller the value of F is, the better the slidability is.

Figure 8:
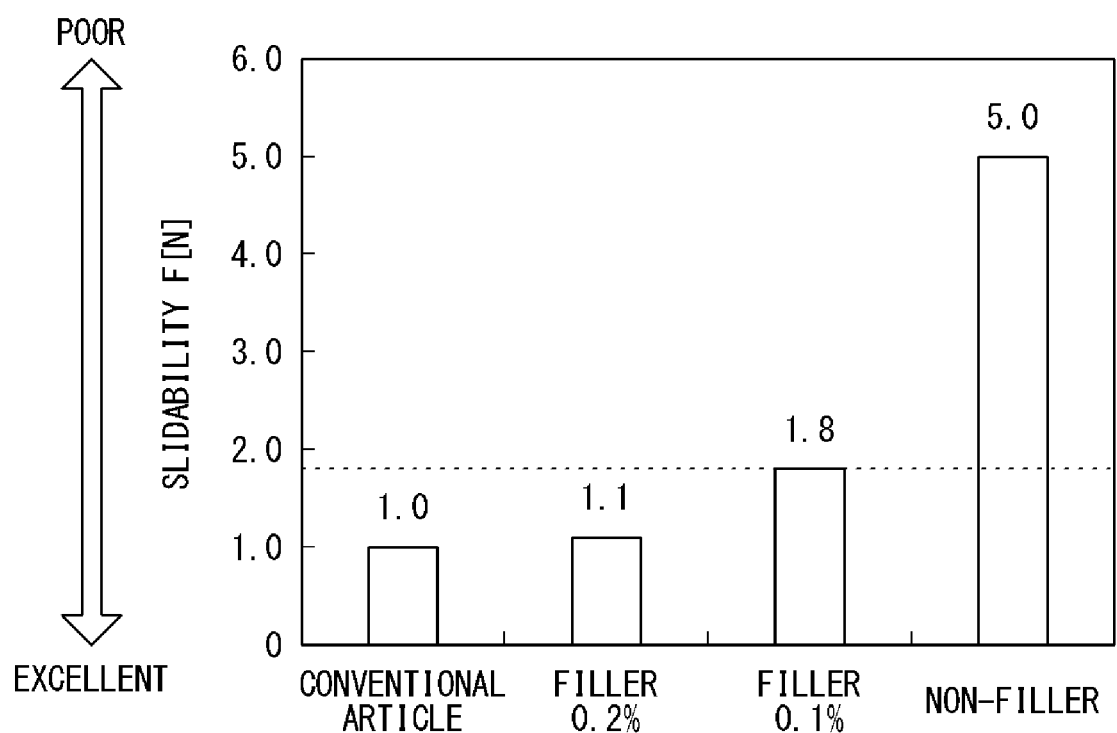
FIG. 8 is a bar graph showing a result of the slidability test.

FIG. 8 is a bar graph showing a result of the slidability test. The value 1.8 of F in the vertical axis is the value of a general polyimide film. From this graph, it is seen that "conventional article", "filler 0.2%", and "filler 0.1%" have slidability equivalent to or greater than or equal to the slidability of the general polyimide film, but "non-filler" does not have good slidability.

When the slidability is not good, the insulating base materials easily adhere to each other, which poses a defect of difficult handling thereof. However, if the insulating base material is attached to the reinforcement portion 16 (FIG. 3), this defect is not so troublesome. Therefore, for usage that requires a withstand voltage performance not less than 2000 V, even if slidability is sacrificed to some extent, it is overwhelmingly meaningful to ensure a withstand voltage performance obtained by employing a non-filler insulating base material or by suppressing the filler content to not greater than 0.2%.

It should be noted that the embodiment herein is to be considered in all respects as illustrative and not restrictive. The scope of the invention is indicated by the appended claims, and all changes which come within the meaning and range of equivalency of the claims are therefore intended to be embraced therein.

REFERENCE SIGNS LIST 1 concentrator photovoltaic panel
1M concentrator photovoltaic module
3 pedestal
3a post
3b base
4 tracking sensor
5 pyrheliometer
11 housing
11a bottom surface
11b flange portion
12 flexible printed circuit
13 concentrating portion
13f Fresnel lens
14 connector
15 adhesive layer
16 reinforcement portion
17 double-sided tape
18 lead frame
19 silicone resin layer
21 cell
100 concentrator photovoltaic apparatus
121, 121s insulating base material 122 electric conductor layer
123 solder portion
124 adhesive layer
125 cover layer

The invention claimed is:

1. A concentrator photovoltaic module comprising:
a housing having a planar bottom surface;
a reinforcement portion which is conductive and mounted to the planar bottom surface;
a first adhesive layer forming a constant thickness layer on the reinforcement portion;
a flexible printed circuit arranged in a plurality of rows on the bottom surface;
a concentrating portion mounted to the housing and formed by a plurality of lens elements being arrayed, each lens element being configured to converge sun light; and
cells mounted to the flexible printed circuit so as to correspond to light-concentrating positions of the respective lens elements, each cell being configured to receive the converged light to generate power, wherein the flexible printed circuit includes:
  a strip-film-shaped insulating base material having flexibility and having a withstand voltage value of at least 2000 V;
  an electric conductor layer formed on the insulating base material and forming a circuit pattern;
  a lead frame of each of the cells mounted to the electric conductive layer,
  a second adhesive layer which covers both end faces of the electric conductive layer in a width direction perpendicular to a longitudinal direction of the electric conductive layer, and
  a cover layer which is provided on the second adhesive layer, and
  with respect to the insulating base material, a thickness thereof is in a range of 10 μm to 50 μm, a principal component thereof is a polyimide, and a filler is included,
wherein the filler is any of calcium pyrophosphate, calcium phosphate, or calcium carbonate,
an upper-limit content of the filler is 0.2% and excluding more than 0.2% to suppress hygroscopicity of the insulating base material even after having immersed the insulating base material in water, and
external surfaces of the cover layer, the second adhesive layer, the insulating base material, and the first adhesive layer provide a path for a current leak from the lead frame to the reinforcement portion.

2. A concentrator photovoltaic panel formed by a plurality of the concentrator photovoltaic modules being arranged, according to claim 1.

* * * * *